United States Patent [19]

Wiggins et al.

[11] Patent Number: 5,206,595
[45] Date of Patent: Apr. 27, 1993

[54] ADVANCED CABLE FAULT LOCATION

[75] Inventors: Carl M. Wiggins; Frank S. Nickel, both of Albuquerque; David E. Thomas, Peralta; Stephen J. Halko, Corrales; Thomas M. Salas; Gary H. Shapiro, both of Albuquerque, all of N. Mex.

[73] Assignee: Electric Power Research Institute, Palo Alto, Calif.

[21] Appl. No.: 757,176

[22] Filed: Sep. 10, 1991

[51] Int. Cl.⁵ .......................................... G01R 31/08
[52] U.S. Cl. ..................................... 324/535; 324/532
[58] Field of Search ............... 324/532, 533, 534, 535, 324/527; 379/26, 25

[56] References Cited

U.S. PATENT DOCUMENTS 3,670,240  6/1972  Maranchak et al. ................. 324/535
4,500,834  2/1985  Ko et al. ............................. 324/535
4,766,549  8/1988  Schweitzer et al. ................ 324/533

FOREIGN PATENT DOCUMENTS

0164711  12/1985  European Pat. Off. ........... 324/534
0215971  9/1986  Japan ................................. 324/532
0165976  6/1989  Japan ................................. 324/527
1104447  7/1984  U.S.S.R. ............................ 324/535
1180816  9/1985  U.S.S.R. ............................ 324/534

Primary Examiner—Jack B. Harvey
Assistant Examiner—Maura K. Regan
Attorney, Agent, or Firm—Leonard Bloom

[57] ABSTRACT

A simple and inexpensive device which is suited for real-time location of a fault occurring anywhere in a residential distribution system by analysis of the propogating fault signal considering the predetermined propagating velocity of the cable.

50 Claims, 5 Drawing Sheets

PROPAGATION VELOCITY IN URD CABLES

| INSULATION | VOLTAGE(KV) | | WIRE # | VELOCITY(ft/ns) |
|---|---|---|---|---|
| EPR | 15 | 220M | 1/0 | 0.508 |
| EPR | 15 | 220M | 4/0 | 0.572 |
| EPR | 5 | | #6 | 0.560 |
| EPR | 5 | | #2 | 0.440 |
| EPR | 15 | | #2AL | 0.540 |
| XLPE | 15 | | 1/0AL | 0.540 |
| HMW | 15 | | 1/0 | 0.500 |
| XLPE | 15 | | 1/0 | 0.504 |
| XLPE | 15 | | 2/0 | 0.486 |
| XLPE | 15 | | 4/0 | 0.478 |
| XLPE | 15 | | #1CU | 0.554 |
| XLPE | 15 | | #2CU/AL | 0.514 |
| XLPE | 15 | | #4CU | 0.516 |
| XLPE | 15 | | 750MCMCU | 0.552 |
| XLPE | 25 | | #1CU | 0.482 |
| XLPE | 25 | | 1/0 | 0.500 |
| XLPE | 25 | | 1/0 | 0.554 |
| XLPE | 35 | | 1/0 | 0.560 |
| XLPE | 35 | | 750MCM | 0.504 |
| PILC | 15 | | 4/0 | 0.482 |

ADVANCED CABLE FAULT LOCATION

BACKGROUND OF THE INVENTION

1. Field of the invention

The present invention relates to the locating of faults in power distribution systems and, more particularly, to a method and apparatus for pinpointing the location of a fault occurring in an underground residential distribution (URD) system by real-time analysis of the fault signal.

2. Description of the Background

It is well-known that faults occurring along a power distribution system can immediately be detected by monitoring a fault signal which propagates as a consequence of the fault. Both phase-to-phase and phase-to-ground faults produce a fault signal in the form of a step-function which reflects throughout the system. Several conventional devices are currently available for detecting such fault signals. However, once the fault signal has been detected it is of equal importance to quickly repair the fault. For this, the fault must be promptly located. Prior art cable fault locators commonly make an ex post facto determination of the fault location. For instance, after a fault has already occurred, the distribution system is taken off-line. Fault-tracing signals are then injected at different points along the distribution circuit, and the fault location is traced based on the circuit response. This process is unduly time consuming, and often results in a lengthy power outage until the fault is located and repaired.

A few devices exist which assess the location of the fault based upon the characteristics of the transient fault signal itself. This is a considerable improvement because the fault can be located immediately upon its occurrence. The above-described lengthy troubleshooting process is avoided, and outage time is minimized.

For example, U.S. Pat. No. 3,710,239 to Nakamura discloses a fault monitoring device which operates with sensors placed at both ends of an isolated section of transmission line. One sensor detects the leading edge of a fault signal and thereupon activates a counter. When the fault signal reaches the second monitor it activates a transmitter which signals the counter to stop. As long as the fault occurs between the sensors, the contents of the counter will be proportional to the fault location. Hence, the contents of the counter can be used to localize the fault.

U.S. Pat. No. 4,857,854 to Matsushima discloses a digital fault locator which measures voltage and phase currents due to a fault signal. This device implements a digital filtering technique in calculating the fault location based upon the fault signal.

U.S. Pat. No. 4,797,805 to Nimmersjo uses a travelling wave model to describe the voltage distribution along the transmission line. The model results are compared to actual measurements of the voltage at both ends of the transmission line. Given the length of the transmission line, the distance to the fault can be calculated.

Although the above-described patents provide an instantaneous indication of the fault location, they all disclose devices which require a plurality of sensors positioned along a transmission line, and the sensors must monitor both line current and voltage. Moreover, the technique used in calculating the fault location is exceedingly complex, which necessitates costly implementing circuitry.

U.S. Pat. No. 4,500,834 to Ko et al. suggest a less complicated and more economical fault locator for an overhead transmission system. Ko et al use a single monitor placed along the transmission line. The monitor is placed in an isolated zone of the transmission line which is protected by relays. The monitor detects the leading edge of a fault signal and monitors the amount of time required for the signal to reflect from the monitor to the end of the isolated zone and back to the monitor. The elapsed time is then compared to a preset time to determine whether the fault occurred within the isolated zone. If so, the device triggers the appropriate relay. Unfortunately, the applications of the Ko et al device are limited. This is because the device was designed only for use with an overhead transmission system. Consequently, a number of design constraints arise. The Ko et al device must be used in a relay-protected zone, and it merely indicates when a fault occurs within the zone. It does not disclose a means for accurately pinpointing the location of the fault. Moreover, the device must ascertain the direction in which a fault signal is propagating. For this, dual sensors are required to sense both current and voltage, and a complex directional fault detection unit is required.

SUMMARY OF THE INVENTION

It is, therefore, an object of the present invention to provide a simple and inexpensive fault locator especially suited for pinpointing the location of faults occurring anywhere within an underground residential distribution system.

It is another object of the invention to provide a fault locator capable of instantaneous real-time location of a fault using a single conventional sensor and an uncomplicated computation of the exact location of the fault.

It is a further object of the invention to increase the range within which a fault can be located, and to increase the accuracy with which the fault location can be determined.

According to the present invention, the above-described and other objects are accomplished by providing a method for locating a fault occurring in an open loop underground residential distribution system. The method includes the steps of sensing a leading edge of a fault signal propagating from a line fault using a sensor positioned proximate to an open point of the distribution system, sensing a reflection of the fault signal with the sensor, measuring a time interval occurring between the sensing of the leading edge and the reflection, determining the distance of the fault from the sensor based on the time interval, and indicating the precise distance of the fault from the sensor. The sensed reflection is the reflection of the original leading edge of the fault signal from the open point to the fault and back to the sensor, which is a signal of opposite polarity travelling in the same direction of the original fault signal. The signal-reflection properties within residential distribution systems make it possible to monitor the entire underground system using a single voltage or current sensor placed at the open point of the system.

In addition, an apparatus is provided for carrying out the above-described method. The apparatus includes an electrical sensor positioned proximate to an open point along a radial power distribution circuit for sensing the leading edge of the fault signal propagating from a line fault, and for sensing the reflection (which likewise is a reflection of the original fault signal from the open point to the fault and back to the sensor), a timer connected to the sensor for measuring a time interval occurring between the leading edge and the reflection a processor for determining the distance of the fault from the sensor, and an indicator for displaying said distance of the fault from the sensor.

BRIEF DESCRIPTION OF THE DRAWINGS

Other objects, features and advantages of the present invention will become more apparent from the following detailed description of preferred embodiments and certain modifications thereof when taken together with the accompanying drawings, in which.

DETAILED DESCRIPTION OF THE PREFERRED EMBODIMENTS

An exemplary underground residential distribution (URD) system of the type commonly employed in the power industry comprises an open-loop primary distribution cable feeding a plurality of pad-mount transformers. One or more residential loads may be supplied by each transformer.

Figure 1:
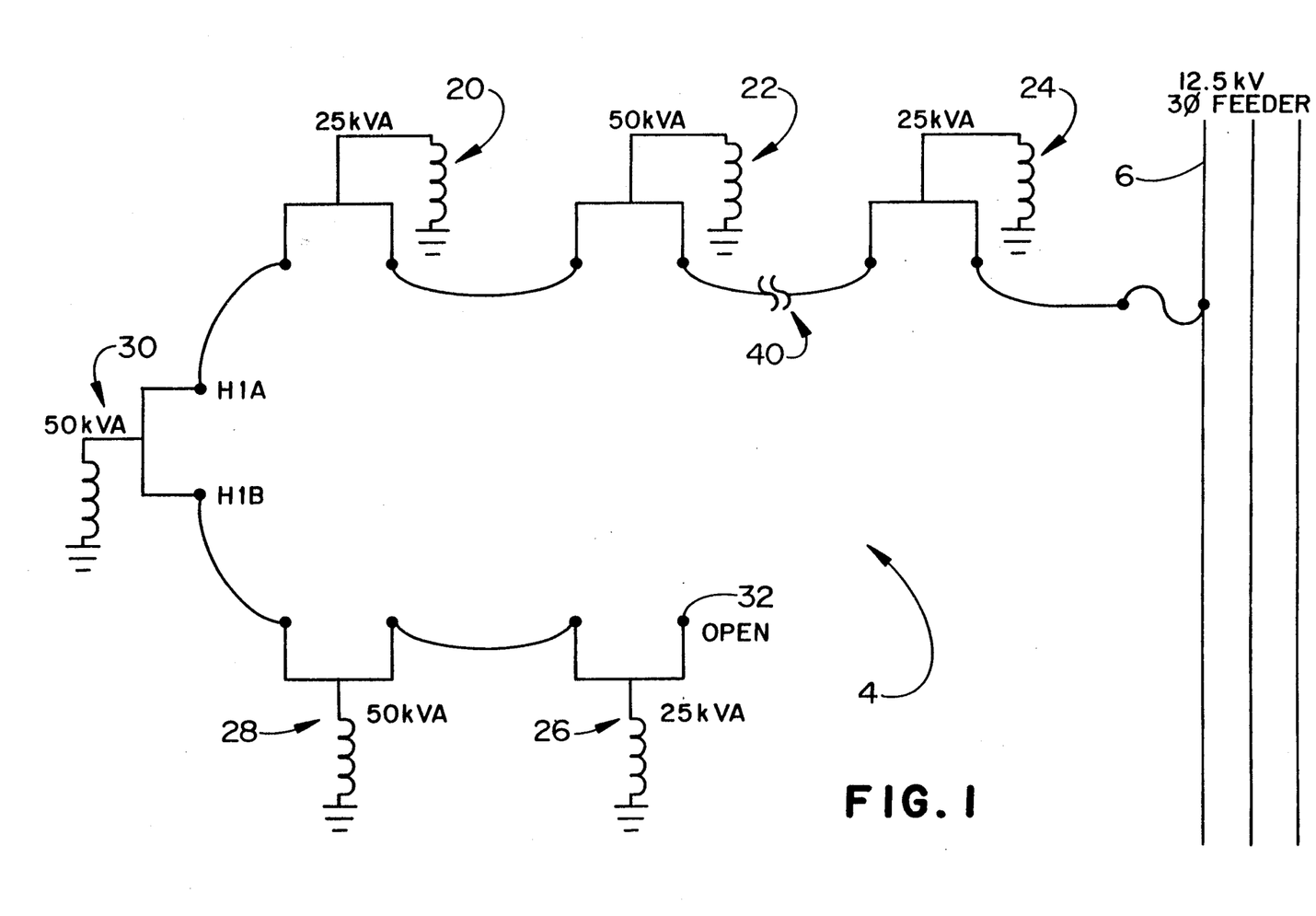
FIG. 1 illustrates a circuit model of a representative underground residential distribution system commonly used in the power industry.

FIG. 1 illustrates a circuit model of a single radial tap underground residential distribution system (URD) as described above Model distribution circuit 4 comprises a 15 kV open-loop primary distribution cable feeding three 25 kVA transformers 20, 24 and 26, and three 50 kVA transformers 22, 28 and 30. The primary distribution cable terminates at an open point 32.

A fault 40 is shown occurring between transformers 22 and 24, although it should be understood that the present invention is capable of locating faults occurring anywhere along underground distribution circuit 4.

Upon the occurrence of fault 40, it is of paramount importance to detect the fault immediately, and to pinpoint its location as quickly as possible. The present invention accomplishes both of these tasks in real-time as the fault occurs.

Figure 2:
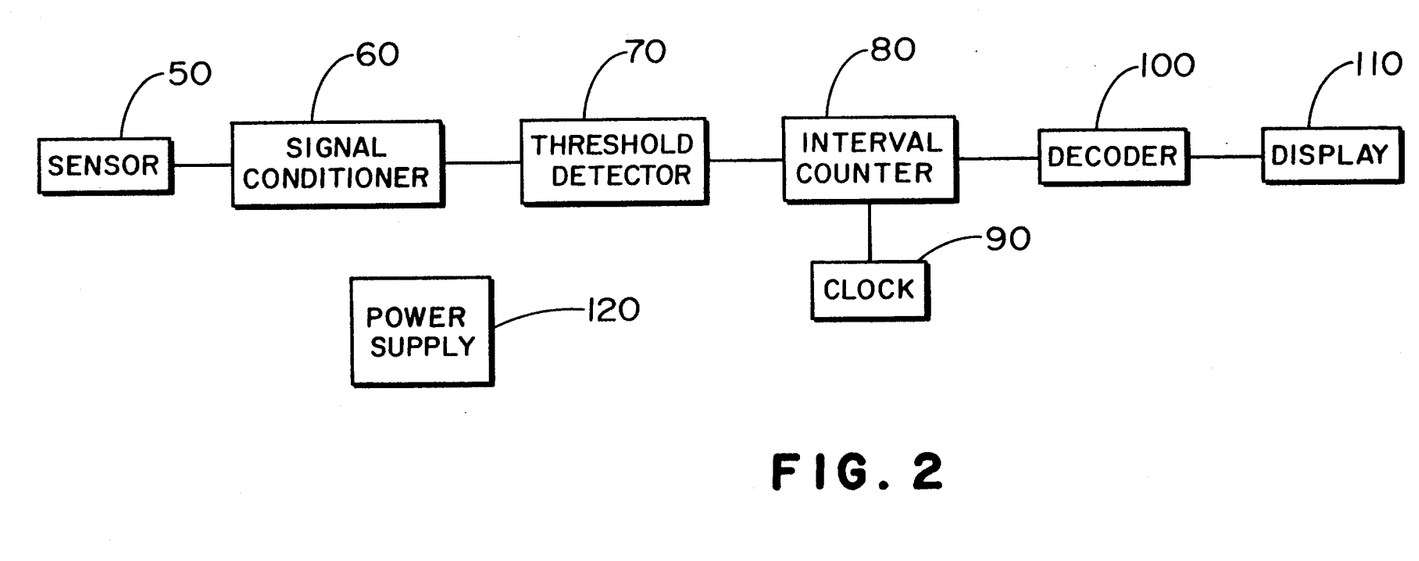
FIG. 2 is a block diagram illustrating one embodiment of the present invention.

FIG. 2 is a block diagram illustrating one embodiment of the present invention which is especially suited for locating faults occurring in the residential distribution circuit of FIG. 1. Sensor 50 may be a replica waveform response current sensor incorporating a toroidal clamp-on probe placed around only the center conductor near the load break elbow. This type of probe produces an output voltage proportional to the current flowing therethrough. Alternatively, sensor 50 may be a time-derivative response voltage sensor placed on a capacitive test voltage tap on the load break elbow. Sensor 50 is connected to signal conditioner 60, which is in turn connected to a threshold detector 70. Signal conditioner 60 may be a conventional variable attenuator calibrated to provide optimal signal strength to threshold detector 70. Threshold detector 70 detects a pulse output of sensor 50 corresponding to the leading edge of a fault signal received thereby. Upon detecting a positive (or negative) pulse, threshold detector 70 triggers an interval counter 80. Similarly, upon detecting a negative (or positive) pulse from sensor 50, threshold detector 70 stops interval counter 80. The inverted pulse from sensor 50 corresponds to the reflection of the fault signal from the open point 32 (near sensor 50), back to the fault, and back again to the sensor 50. Interval counter 80 is clocked by clock 90. The interval counter 80 is also connected to decoder 100 which calculates the distance to the fault based upon the contents of counter 80. The calculated electrical distance is output to display 110 which provides a visual indication of the fault location. In the preferred embodiment, the indication comprises a measure of the distance from sensor 50 to the fault.

FIGS. 3-6 illustrate the operation of the advanced cable fault locator according to the present invention. It is an integral feature of the invention that sensor 50 is placed immediately before the open point 32 of the radial distribution circuit 4 shown in FIG. 1, preferably within approximately twelve inches from open point 32.

Figure 3:
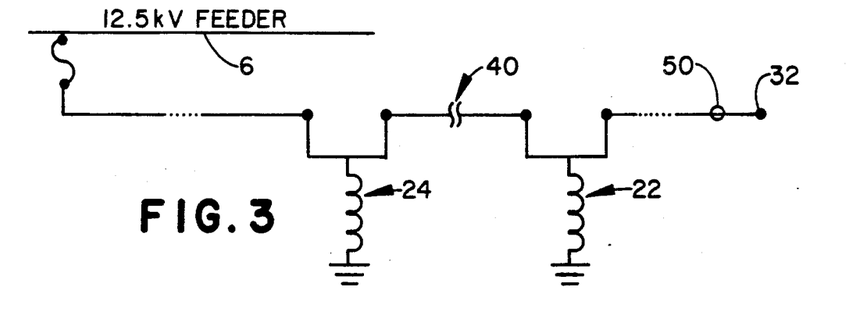
FIG. 3 is a schematic diagram illustrating the placement of sensor 50 near the open point 32 of an underground residential distribution circuit.

As shown in FIG. 3, a fault occurring at point 40 will generate a fault signal in the approximate form of a step-function which propagates in the direction of sensor 50.

Figure 4:
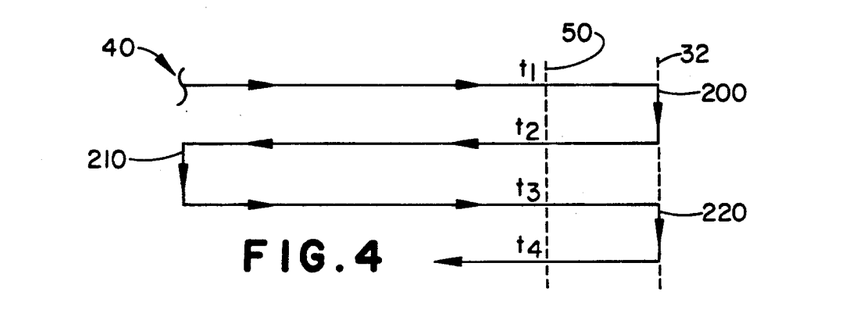
FIG. 4 illustrates the propagation path of a fault signal in the circuit of FIG. 3.

FIG. 4 illustrates the propagation path of the fault signal. As shown, the fault signal travels along the distribution circuit 4 until it reaches open point 32, just past the point at which the leading edge reaches sensor 50.

Figure 5:
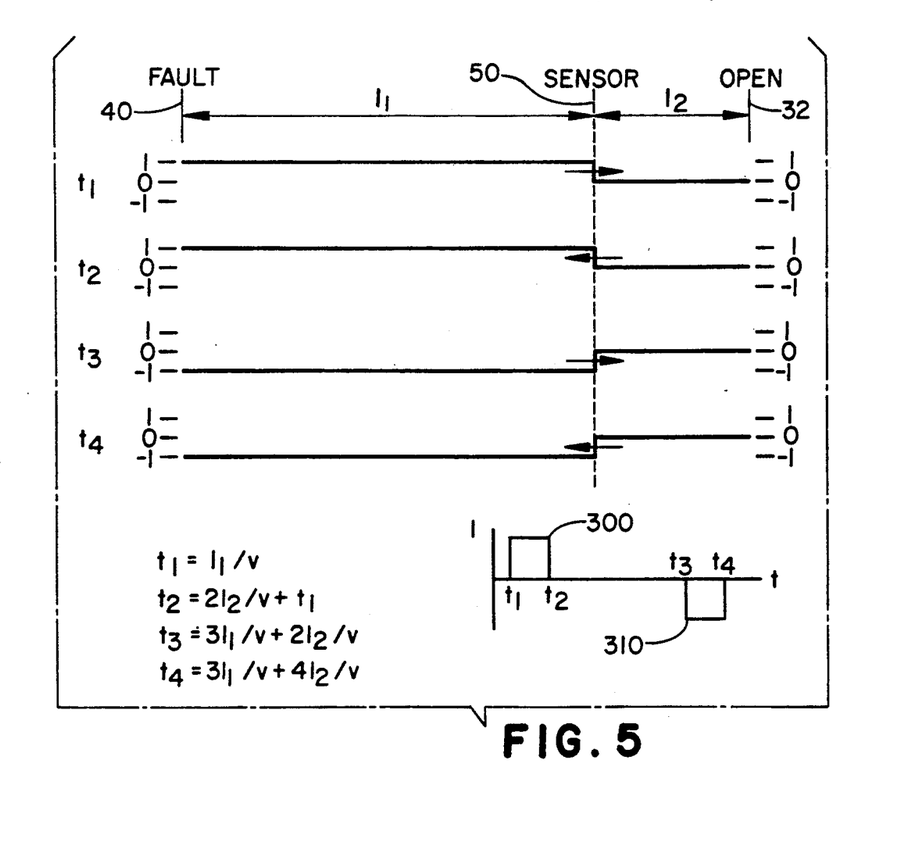
FIG. 5 illustrates the timing characteristic of the fault signal as it propagates along the path shown in FIG. 4.

FIG. 5 illustrates the timing characteristics of the fault signal as it propagates along the path shown in FIG. 4 reflecting between the open point 32 and the fault 40 (a short circuit). The fault signal can be detected as a current or voltage wave, hence sensor 50 may be either a current or a voltage sensor. The reflection characteristics of current and voltage waves are opposite from each other at open and short circuits. Therefore, a current sensor will be used for the purpose of the following discussion to illustrate the process described in FIG. 5. The leading edge of the (assumed positive amplitude) step function fault signal initiated at time $t=0$ travels a distance $l_1$ and arrives at sensor 50 at time $t_1$ as shown in FIG. 5. Where a current sensor is used, the leading edge of the fault signal appears at sensor 50 to be a transient positive current pulse 300 beginning at time $t=t_1$ as shown in FIG. 5. A voltage sensor will detect the corresponding voltage pulse.

The fault signal current will then reflect with inverted polarity from open point 32 (designated 200 in FIG. 4), producing an equal and opposite (negative amplitude) reflected signal propagating in the reverse direction back toward sensor 50 and fault 40. The negative amplitude, reflected fault signal will begin to cancel with the original (positive polarity) fault signal at sensor 50 at time $t_2$, producing a nearly zero amplitude signal level at sensor 50 until time $t_3$ as explained below. Since sensor 50 is a short distance 12 from open point 32 (designated in FIG. 5), there is a small time delay $t_2-t_1$ before the incident and reflected signals begin to cancel resulting in the positive pulse 300 shown in FIG. 5. Meanwhile, the reflected (and negative polarity) current signal from open point 32 will reach fault 40 (designated by point 210 in FIG. 4) and will be re-reflected back toward the sensor 50 and open point 32. The current signal re-reflected from the fault (a short circuit) will have the same negative polarity, but nearly twice the amplitude of the once-reflected incident signal. The twice-reflected fault current signal reaches sensor 50 at time $t_3$, and is seen as a negative polarity, unit amplitude step function. This signal then reaches open point 32 (at point 220 in FIG. 4), reflects and inverts polarity (to positive), travels back to sensor 50 arriving at time $t_4$, and cancels the negative polarity, twice-reflected signal. Because of the time difference $t_4-t_3$ between the two signals arriving at sensor 50, the cancellation results in a negative current pulse 310 as shown in FIG. 5.

Figure 6:
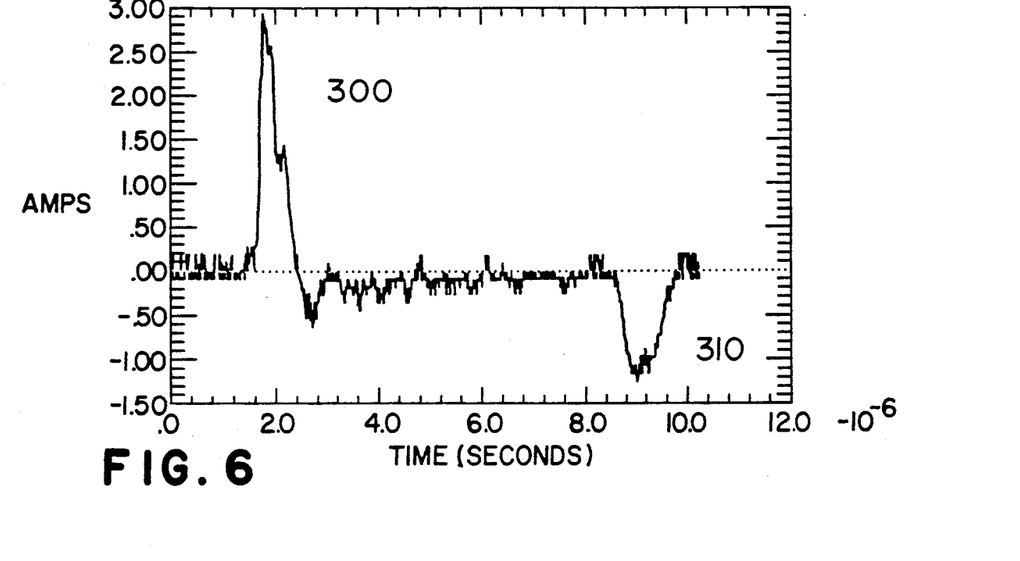
FIG. 6 illustrates the actual electrical response of the circuit of FIG. 3 as measured by sensor 50.

FIG. 6 illustrates the actual response of the circuit of FIG. 3 as measured at sensor 50. A primary advantage of the invention is readily apparent from the graph. The placement of sensor 50 near the open point of the radial distribution circuit 4 results in a waveform which yields an unambiguous and accurate indication of the time difference between the arrival of the incident fault wave and its first reflection from the fault at sensor 50. This is because the original fault signal nearly cancels with its reflected counterpart. Hence, an interval will pass between pulses 300 and 310 during which sensor 50 sees a signal of essentially zero amplitude. The unequivocal positive (or negative) pulse 300 and negative (or positive) pulse 310 results from the placement of the single sensor 50 near, but not exactly at, the open point 32. The time difference (time at 310 minus time at 300 in FIG. 6) is equal to the time required for the fault wave to travel from sensor 50 to the fault, reflect from it, and travel back to sensor 50. FIG. 6 also illustrates how the accuracy of determining this time difference is enhanced by the manner in which sensor 50 is installed on the circuit. It is an integral feature of the invention that sensor 50 is placed immediately before the open point 32 of the radial distribution circuit 4 shown in FIG. 1, preferably within about twelve inches from open point 32, in order to minimize the width of peaks 300 and 310 in FIG. 6, thereby reducing the ambiguity in determining the times at which the peaks occur, and to cause the fault waveshape measured by sensor 50 to be invariant with circuit length and fault distance. The invariant waveshape is an integral feature of the invention providing a predictable signal pattern upon which an automatic signal processing algorithm for fault location is based. This simplification eliminates the need for complex and costly equipment, signal processing and skilled operators required in the prior art devices to differentiate between the many fault signal components appearing on the distribution lines.

Referring back to FIG. 4, if the total time taken for the signal to traverse points 200 and 220 may be represented by t, then the distance d from the sensor 50 to fault 40 may be easily calculated by the expression:

$$d = v^*t/2$$

where v is the propagation velocity through the cable. This calculation is easily completed by decoder 100 (of FIG. 2) because, unlike some prior art fault locators, the lengths of the distribution cables need not be known. The only variable is the propagation velocity of the fault signal through the cable, which is a value characteristic of the cable type. This propagation velocity may easily be determined in advance. Hence, a range of characteristic propagation velocities may be stored in decoder 100.

Figure 7:
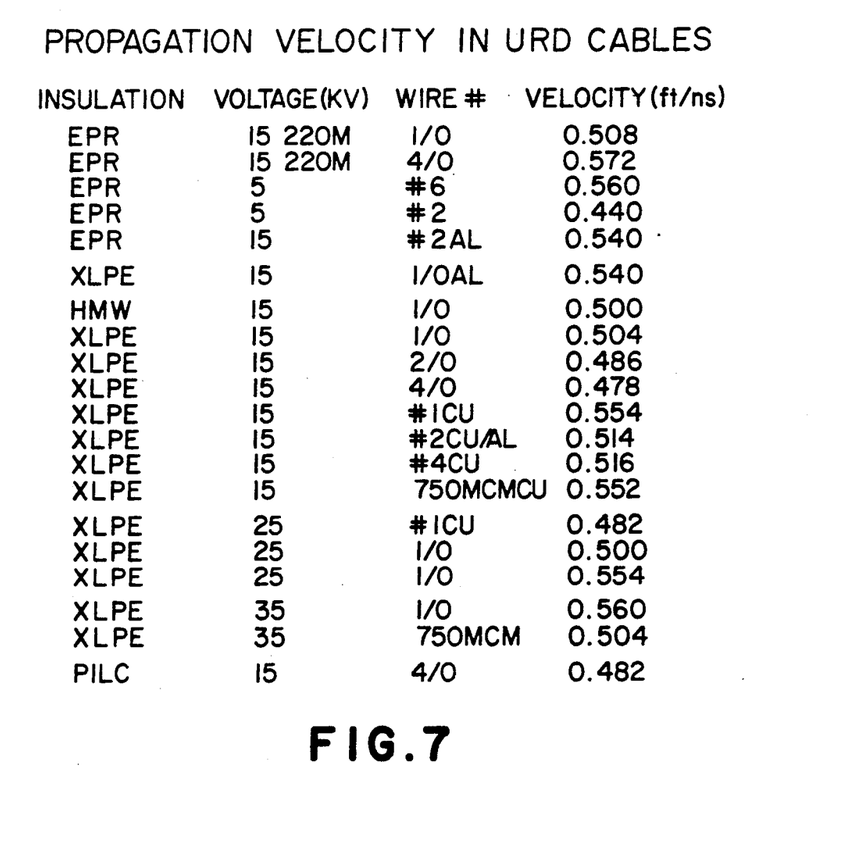
FIG. 7 lists the propagation velocities characteristic of various types of cable commonly used in underground residential distribution systems.

FIG. 7 shows the propagation velocities for a number of cable types commonly used in underground residential distribution systems. It should be noted that accurate fault location depends on the accuracy of the propagation velocity. Therefore, even though an average value may yield acceptable results, it is preferable to use the more exact data shown in FIG. 7.

The distance to the fault as calculated by decoder 100 is then output to display 110.

It has been demonstrated that the advanced fault locator will detect faults at a distance of at least 6000 feet when sensor 50 is either a derivative response voltage sensor or a replica response current sensor.

It has also been found that a surge arrestor may be used at the open point of the underground residential distribution system to significantly increase the amplitudes of the transient fault waveforms. Hence, a surge arrestor can be used to extend the maximum range of fault location.

In addition to the extended range of fault location, the present invention also expedites corrective measures. Following the occurrence of a fault in a looped residential distribution system (FIG. 8), service can be restored most quickly by disconnecting the damaged (faulted) section of cable from the distribution system, closing the normally open point 32 (unless it is at one end of the faulted cable section), and re-energizing the URD system. The above-described procedure is only possible if the damaged section of cable can be pinpointed, and this requires an accurate determination of the fault location to within the smallest distance between two adjacent padmount transformers (typically $\geq 100$ feet). Based on empirical data, the accuracy of the fault locator according to the present invention is between 0.5% and 2% of the distance of the fault from sensor 50. These numbers clearly show that the location of a fault can be pinpointed to within the distance between two padmount transformers on a typical distribution circuit.

Figure 8:
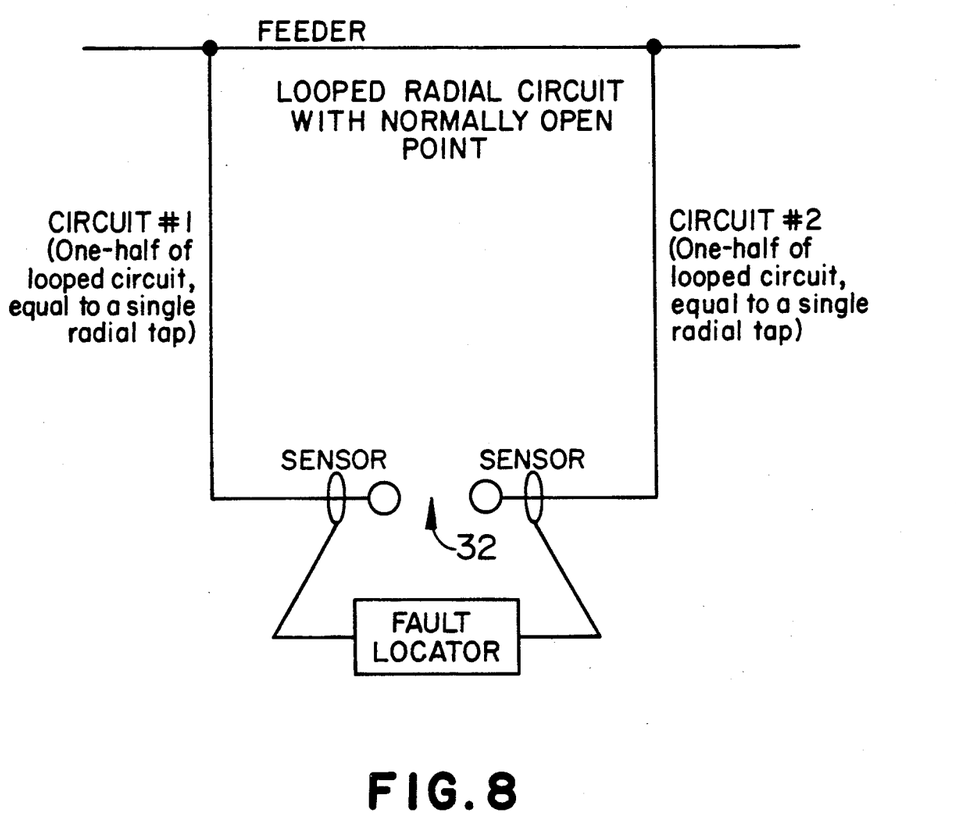
FIG. 8 illustrates a alternate embodiment of the present invention in which two sensors are used with a single device to monitor a pair of radial circuits arranged where both open points occur at the same location. On three-phase open-looped systems all six circuits can be monitored by connecting six sensors to a single unit located at the common open point.

FIG. 8 illustrates another embodiment of the present invention which is capable of monitoring both sides of open-looped underground residential circuits. Pairs of radial distribution circuits (or radial taps) are commonly arranged as two halves of an open loop so that their open points share a common location, ordinarily at a padmount transformer. The embodiment of FIG. 8 is especially economical because a single unit is capable of monitoring both distribution circuits in a pair. The proximity of the two open points makes it possible to connect two sensors to a single unit. Hence, the single embodiment of FIG. 8 is capable of monitoring both circuits.

Having now fully set forth the preferred embodiments and certain modifications of the concept underlying the present invention, various other embodiments as well as certain variations and modifications of the embodiment herein shown and described will obviously occur to those skilled in the art upon becoming familiar with said underlying concept. It is to be understood, therefore, that within the scope of the appended claims, the invention may be practiced otherwise than as specifically set forth herein.

What is claimed is:

1. A method for locating a fault occurring in an underground residential power distribution (URD) circuit having a predetermined propagation velocity, comprising:

positioning a sensor proximate to an open point in said power distribution circuit;

sensing a first electrical signal propagating from a line fault using said a sensor;

sensing a second electrical signal with said sensor, said second signal being produced by said first signal reflecting from said open point to said fault and back to said sensor;

measuring a time interval occurring between sensing of said first and second electrical signals;

determining a distance of said fault from said sensor based on said time interval and predetermined propagation velocity; and indicating said distance of said fault from said sensor to allow location of said fault.

2. The method according to claim 1, wherein said electrical signals are current waveforms.

3. The method according to claim 3, wherein said sensor is a replica response current sensor.

4. The method according to claim 1, wherein said electrical signals are voltage waveforms.

5. The method according to claim 5, wherein said sensor is a derivative response voltage sensor.

6. The method according to claim 1, wherein said distance is determined by multiplying a cable propagation velocity by one-half of said time interval.

7. The method according to claim 1, wherein said calculated distance of said fault from said sensor is within a 2% error.

8. The method according to claim 1, further comprising the step of installing a surge arrestor at said open point for increasing a range within which a fault can be located.

9. A method for locating a fault occurring in an underground residential power distribution (URD) circuit, comprising:

storing a propagation velocity in a memory, said propagation velocity being characteristic of a type of cable used in said power distribution circuit;

positioning a sensor proximate to an open point in said power distribution circuit;

sensing a first electrical signal propagating from a line fault using said sensor;

sensing a second electrical signal with said sensor, said second signal being produced by said first signal reflecting from said open point to said fault and back to said sensor;

measuring a time interval occurring between sensing a said first and second electrical signals;

calculating a distance of said fault from said sensor by multiplying said stored propagation velocity by said measured time interval and dividing by two; and indicating a location of said fault based upon said calculated distance.

10. The method according to claim 9, wherein said electrical signals are current waveforms.

11. The method according to claim 10, wherein said sensor is a replica response current sensor.

12. The method according to claim 9, wherein said electrical signals are voltage waveforms.

13. The method according to claim 12, wherein said sensor is a derivative response voltage sensor.

14. The method according to claim 9, wherein said calculated distance of said fault from said sensor is within a 2% error.

15. The method according to claim 9, further comprising the step of installing a surge arrestor at said open point for increasing a range within which a fault can be located.

16. The method according to claim 9, further comprising the step of communicating said calculated distance to a control center.

17. A method for locating a fault occurring in an underground residential power distribution (URD) circuit, said distribution circuit having an open point, the method comprising the steps of:

positioning a sensor proximate to an open point in said power distribution circuit;

storing a propagation velocity in a memory, said propagation velocity being characteristic of a type of cable used in said power distribution circuit;

injecting an electrical signal in said power distribution circuit at a point opposite said open point;

sensing a first reflection of said signal propagating from a line fault by means of said sensor;

sensing a second reflection of said signal, said second reflection being created by said first signal reflecting from said open point to said fault and back to said sensor, and said second signal being of opposite polarity than said first electrical signal;

measuring a time interval occurring between sensing of said first and second reflections;

calculating a distance of said fault from said sensor by multiplying said propagation velocity by said time interval and dividing by two; and indicating a location of said fault based upon said distance.

18. The method according to claim 17, wherein said electrical signal is a single high voltage pulse from a pulse generator.

19. The method according to claim 17, wherein said calculated distance of said fault from said sensor is within a 2% error.

20. The method according to claim 17, further comprising the step of installing a surge arrestor at said open point for increasing a range within which a fault can be located.

21. A method for locating a fault occurring in an underground residential power distribution (URD) circuit, comprising:

positioning a sensor proximate to an open point in said power distribution circuit;

storing a propagation velocity in a memory, said propagation velocity being characteristic of a type of wire used in said power distribution circuit;

sensing a first reflection of said signal propagating from a line fault by means of said sensor;

sensing a second reflection of said signal, said second reflection created by said first signal reflecting from said open point to said fault and back to said sensor, and said second signal being of opposite polarity than said first electrical signal;

measuring a time interval occurring between sensing of said first and second reflections;

calculating a distance of said fault from said sensor by multiplying said stored propagation velocity by said time interval and dividing by two; and communicating fault location information to a control center.

22. The method according to claim 21, wherein said electrical signals are current waveforms.

23. The method according to claim 22, wherein said sensor is a replica response current sensor.

24. The method according to claim 21, wherein said electrical signals are voltage waveforms.

25. The method according to claim 24 wherein said sensor is a derivative response voltage sensor.

26. The method according to claim 21, wherein said calculated distance of said fault from said sensor is within a 2% error.

27. The method according to claim 21, further comprising the step of installing a surge arrestor at said open point for increasing a range within which a fault can be located.

28. An apparatus for locating a fault occurring in a power distribution circuit, comprising:
    electrical sensing means positioned proximate to an open point along an underground residential power distribution (URD) circuit for sensing a first electrical signal propagating from a line fault, and for sensing a second electrical signal which is a reflection of said first signal from said open point to said fault and back to said sensor, said second signal being of opposite polarity than said first electrical signal;
    timing means connected to said sensing means for measuring a time interval occurring between sensing of said first and second electrical signals;
    processing means for determining a distance of said fault from said sensor based on said time interval; and
    indicating means for displaying a location of said fault.

29. The apparatus according to claim 28, wherein said power distribution circuit is an underground residential power distribution circuit.

30. The apparatus according to claim 28, wherein said first and second electrical signals are current waveforms.

31. The method according to claim 30, wherein said sensing means is a replica response current sensor.

32. The apparatus according to claim 28, wherein said first and second electrical signals are voltage waveforms.

33. The method according to claim 32, wherein said sensing means is a derivative response voltage sensor.

34. The apparatus according to claim 28, wherein said processing means determines said distance by multiplying a cable propagation velocity by one-half of said time interval.

35. The apparatus according to claim 34, further comprising a surge arrestor for increasing a range within which a fault can be located.

36. A device for locating a fault occurring in an underground residential power distribution (URD) system, comprising:
    electrical sensing means positioned proximate to an open point along a power distribution system for sensing a first electrical signal propagating from a line fault, and for sensing a second electrical signal caused by said first signal reflecting from said open point to said fault and back to said sensor;
    timing means connected to said sensing means for measuring a time interval occurring between said first and second electrical signals;
    processing means for determining a location of said fault based on said time interval, said processing means including a memory for storing a propagation velocity characteristic of a type of cable used in said power distribution system, whereby said processing means determines said fault location by multiplying said stored propagation velocity by said time interval and dividing by two; and
    a display connected to said processing means for indicating a location of said fault.

37. The device according to claim 36, wherein said first and second electrical signals are current waveforms.

38. The device according to claim 37, wherein said sensing means is a replica response current sensor.

39. The device according to claim 36, wherein said first and second electrical signals are voltage waveforms.

40. The method according to claim 39, wherein said sensing means is a derivative response voltage sensor.

41. The device according to claim 36, further comprising a surge arrestor for increasing a range within which a fault can be located.

42. The device according to claim 36, wherein said processing means further comprises an interface for allowing an operator to specify said type of cable used in said power distribution circuit.

43. A device for locating a fault occurring in an underground residential power distribution (URD) circuit, comprising:
    a high voltage pulse generator for injecting an electrical signal in said power distribution circuit;
    electrical sensing means positioned proximate to an open point along a power distribution system for sensing a first reflected signal produced from said injected signal reflecting from a line fault, and for sensing a second electrical signal caused by said first signal reflecting from said open point to said fault and back to said sensor;
    timing means connected to said sensing means for measuring a time interval occurring between said first and second electrical signals;
    processing means for determining a location of said fault based on said time interval, said processing means including a memory for storing a propagation velocity characteristic of a type of cable used in said power distribution system, whereby said processing means determines said fault location by multiplying said stored propagation velocity by said time interval and dividing by two; and
    a display connected to said processing means for indicating a location of said fault.

44. The device according to claim 43, wherein said first and second electrical signals are current waveforms.

45. The device according to claim 44, wherein said sensing means is a replica response current sensor.

46. The device according to claim 43, wherein said first and second electrical signals are voltage waveforms.

47. The method according to claim 46, wherein said sensing means is a derivative response voltage sensor.

48. The device according to claim 43, further comprising a surge arrestor for increasing a range within which a fault can be located.

49. The device according to claim 43, further comprising communication means for communicating fault location information to a control center.

50. An apparatus for locating a fault occurring in a pair of adjacent underground residential power distribution (URD) circuits, comprising:
- a first electrical sensor positioned proximate to a first open point along a first power distribution circuit;
- a second electrical sensor positioned proximate to a second open point along a second power distribution circuit;
- timing means connected to said first sensor and second sensor for measuring a time interval occurring between electrical signals;
- a processor connected to said timing means; and
- indicating means for displaying a location of a fault;
- whereby said first electrical sensor senses a first electrical signal propagating from a line fault in said first distribution circuit and a reflection thereof from said first open point to said fault and back to said first sensor, and said second electrical sensor senses a second electrical signal propagating from a line fault in said second distribution circuit and a reflection thereof from said second open point to said fault and back to said second sensor, said timing means determining a time occurring between said respective electrical signals and reflections thereof and inputting said time to said processor, whereupon said processor calculates a distance to said faults and outputs said distance to said indicating means.

* * * * *